United States Patent [19]
Sakamoto et al.

[11] Patent Number: 5,626,675
[45] Date of Patent: May 6, 1997

[54] RESIST PROCESSING APPARATUS, SUBSTRATE PROCESSING APPARATUS AND METHOD OF TRANSFERRING A PROCESSED ARTICLE

[75] Inventors: Yasuhiro Sakamoto; Masami Akimoto; Kiyohisa Tateyama; Shinzi Kitamura, all of Tosu, Japan

[73] Assignees: Tokyo Electron Limited; Tokyo Electron Kyushu Limited, both of Japan

[21] Appl. No.: 340,758

[22] Filed: Nov. 16, 1994

[30] Foreign Application Priority Data

Nov. 18, 1993 [JP] Japan .................................. 5-312539
Dec. 24, 1993 [JP] Japan .................................. 5-347868

[51] Int. Cl.$^6$ .................................. B05C 13/00
[52] U.S. Cl. .................. 118/663; 118/712; 118/52; 118/56; 118/500; 414/935; 134/902
[58] Field of Search .................. 118/663, 677, 118/712, 52, 56, 500, 501; 414/935, 939, 941, 225, 222, 217; 901/43; 134/902

[56] References Cited

U.S. PATENT DOCUMENTS

| | | | |
|---|---|---|---|
| 4,985,722 | 1/1991 | Ushijima et al. | 414/416 |
| 5,061,144 | 10/1991 | Akimoto et al. | 118/500 |
| 5,297,910 | 3/1994 | Yoshioka et al. | 414/225 |
| 5,364,222 | 11/1994 | Akimoto et al. | 414/416 |

FOREIGN PATENT DOCUMENTS

| | | | |
|---|---|---|---|
| 2120341 | 7/1987 | Japan . | |
| 2252147 | 11/1987 | Japan | 414/941 |
| 3229290 | 9/1988 | Japan . | |
| 5036814 | 2/1993 | Japan | 414/935 |
| 5036815 | 2/1993 | Japan | 414/935 |

*Primary Examiner*—Laura Edwards
*Attorney, Agent, or Firm*—Graham & James LLP

[57] ABSTRACT

A substrate processing apparatus has an article transferring unit for transferring articles, and an arm assembly is provided on the transferring unit. Each arm of the arm assembly is provided with pawls for contacting and supporting undersurface portions of the peripheral side wall of each of the articles, and one or more sucking portions are provided on the upper surface of the arm and are disposed above the corresponding pawl or pawls. The pawls, or the sucking portion or sucking portions are selected for every process, and supporting or holding of each of the articles and the required transfer of each of the articles are performed. The transfer can be performed by changing the operating range of each of the arms without replacing the arms. Taking each of the articles in and out of the processing units are carried out smoothly and a series of processes are achieve efficiently.

15 Claims, 16 Drawing Sheets

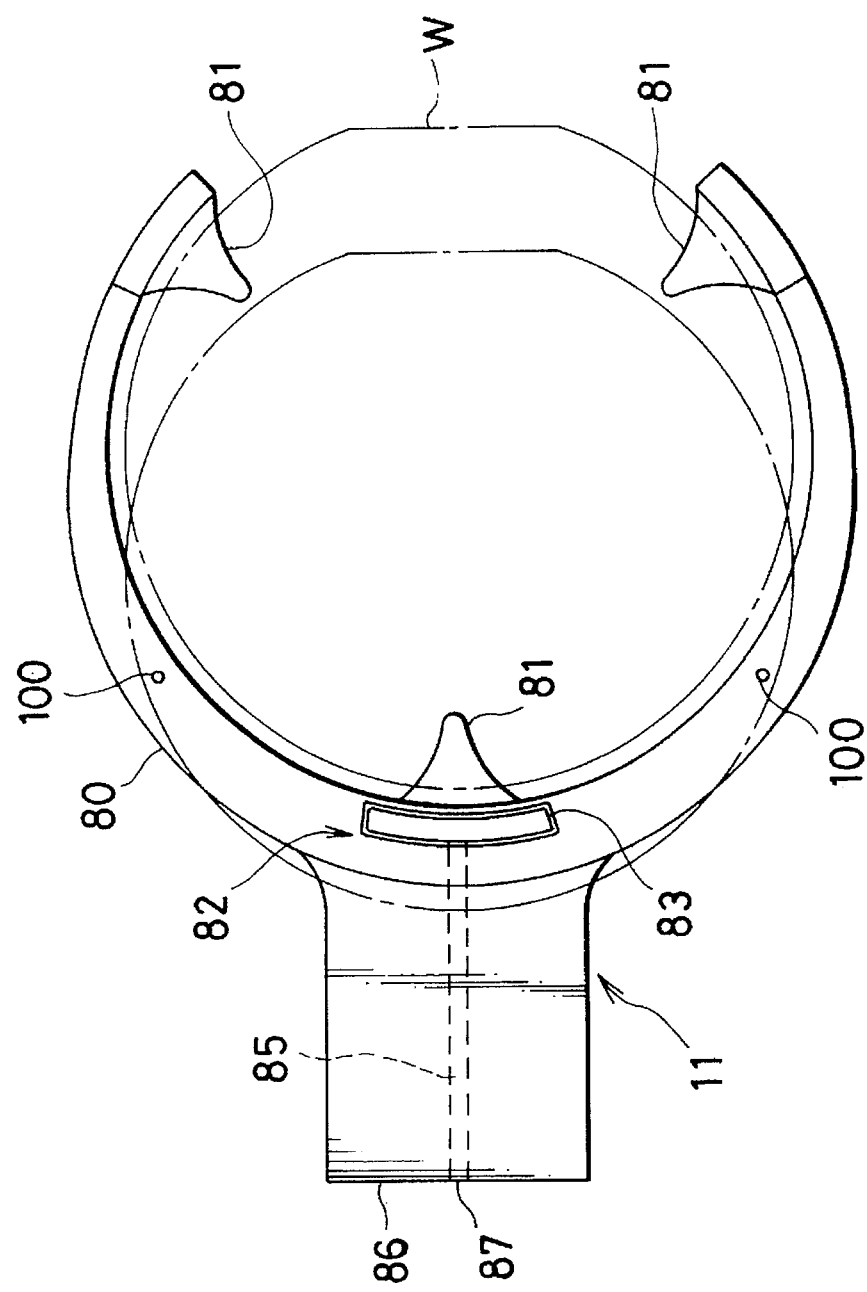
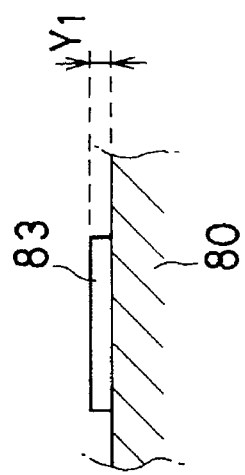
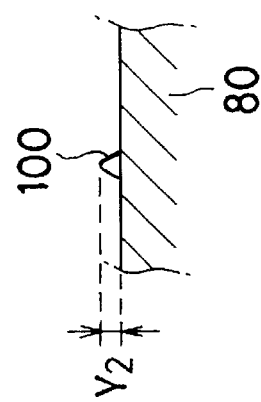

RESIST PROCESSING APPARATUS, SUBSTRATE PROCESSING APPARATUS AND METHOD OF TRANSFERRING A PROCESSED ARTICLE

BACKGROUND OF THE INVENTION

A. Field of the Invention

The present invention relates to an apparatus for processing an article to be processed such as a semiconductor substrate or an LCD substrate and an apparatus for transferring such an article, and more particularly to an apparatus for applying a processing liquid such as a resist liquid to the surface of the article to be processed and an apparatus and a method for transferring an article to be resist-processed.

B. Description of the Related Art

The general method of manufacturing semiconductor device comprises a series of processes in which photoresist is applied to a semiconductor wafer, a reduced circuit pattern is formed by means of lithographic technique, the circuit pattern is transcribed to the photoresist and the transcribed circuit pattern is developed.

One of such processing methods is disclosed in the Laid-open Japanese Utility Model Application Publication No. 62-120341. Transfer of a semiconductor wafer by means of a belt and by means of vacuum suction as semiconductor transferring technique is widely known from Laid-open Japanese Patent Application Publication No. 63-229290, for example.

Instead of a resist liquid having low viscosity which is more commonly employed in an apparatus to apply resist or the like, when a process liquid having high viscosity such as polyamide is applied to a wafer, the polyamide is not removed from the peripheral side wall of the wafer by a side rinse process but is likely to remain there.

Attachment of a residue of the process liquid to the portion of the transfer mechanism which contacts a wafer makes it hard to release the wafer from the transfer mechanism and the wafer cannot be transferred smoothly.

Further, a problem is likely to occur where polyamide attached to and left on the periphery of wafer is peeled off and gets attached to the body of the wafer.

It is required in some processes that the side process should not be performed even if a resist liquid having normally low viscosity is used. If wafers are moved in the process apparatus with the resist liquid applied to the wafers in these cases, the transfer mechanism tends to be contaminated by the resist liquid. The resist is dried and becomes contaminants. Due to vibrations or the like produced during transportation, the dried resist is likely to be peeled off and get attached again to the wafers as particles.

SUMMARY OF THE INVENTION

The present invention was made to overcome the above-mentioned drawbacks of the conventional technique, and the object thereof is to provide a capability to select one of at least two handlers of a semiconductor wafer and the like in each process. Such a handler can be a plurality of supporting elements such as pawls for supporting the article to be processed at various points around its peripheral edge, and are provided on an arm which holds the article and constitutes a transfer mechanism for transferring the article processed by a substrate process such as application of a resist liquid, or by a pre-process or a post-process of the substrate process. A handler can also include at least one suction portion formed on the upper surface of the arm and disposed over the corresponding pawl. Such a handler contacts and supports the article from its underside near the peripheral edge. In this arrangement, a plurality of processes can be performed by changing and controlling the moving area of the arm without replacing the arm.

The present invention is to provide a processing apparatus which eliminates the disadvantage in which an article to be processed cannot be released from the arm due to the residue of the process liquid. The processing apparatus can perform an efficient series of processes and can prevent the dried and peeled-off process liquid from being attached as particles to a wafer in a process in which the peripheral side wall of an article to be processed must be held in non-contact with the arm even in the case where the processes are performed by the use of a process liquid having high viscosity such as polyamide or in the case where the side rinsing should not be performed.

The present invention provides a substrate processing apparatus including a plurality of processing mechanisms for performing required processes on a substrate and a transfer mechanism for transferring the substrate to the processing mechanisms, the transfer mechanism comprising at least one arm provided with at least two handlers, one of which may be a supporter for supporting the substrate at multiple locations around the outer edge and the other can be a holder having at least one suction portion contacting and holding the wafer in the vicinity of the peripheral side wall thereof, a detector for detecting the thickness of a layer formed on the wafer and a selector for selecting either the supporter or the holder of the arm according to the detected result of the detector.

A plurality of pawls for supporting the article at a plurality of locations by the peripheral side wall of the article to be processed are provided on the arm for holding the article. Each pawl is formed on the outer peripheral part of the upper surface with at least one suction portion which contacts and supports the wafer in the vicinity of the peripheral side wall of the wafer. This arrangement allows for handling of the article either by holding it by its peripheral side wall or by vacuum suction, and the selection can be made for each process. Various articles can be processed by changing and controlling the moving range of the arm without replacing the arm or the handlers.

In the process in which the peripheral side wall of the article to be processed must be held in non-contact with the arm, the article is transferred by using the vacuum suction means. In the process in which the peripheral side wall of the article can be held in contact with the arm, on the other hand, the article is held by its peripheral side wall, and is accurately centered with respect to the arm.

BRIEF DESCRIPTION OF THE DRAWINGS

FIG. 19a is a general plan view showing another embodiment of an arm which is different from that of FIG. 5;

FIG. 19b is a general cross-sectional view of a main part of the arm of FIG. 19a;

FIG. 19c is a general cross-sectional view of another main part of the arm of FIG. 19a;

DETAILED DESCRIPTION OF THE PREFERRED EMBODIMENTS

The present invention will be described by way of the preferred embodiments with reference to the accompanying drawings.

Figure 1:
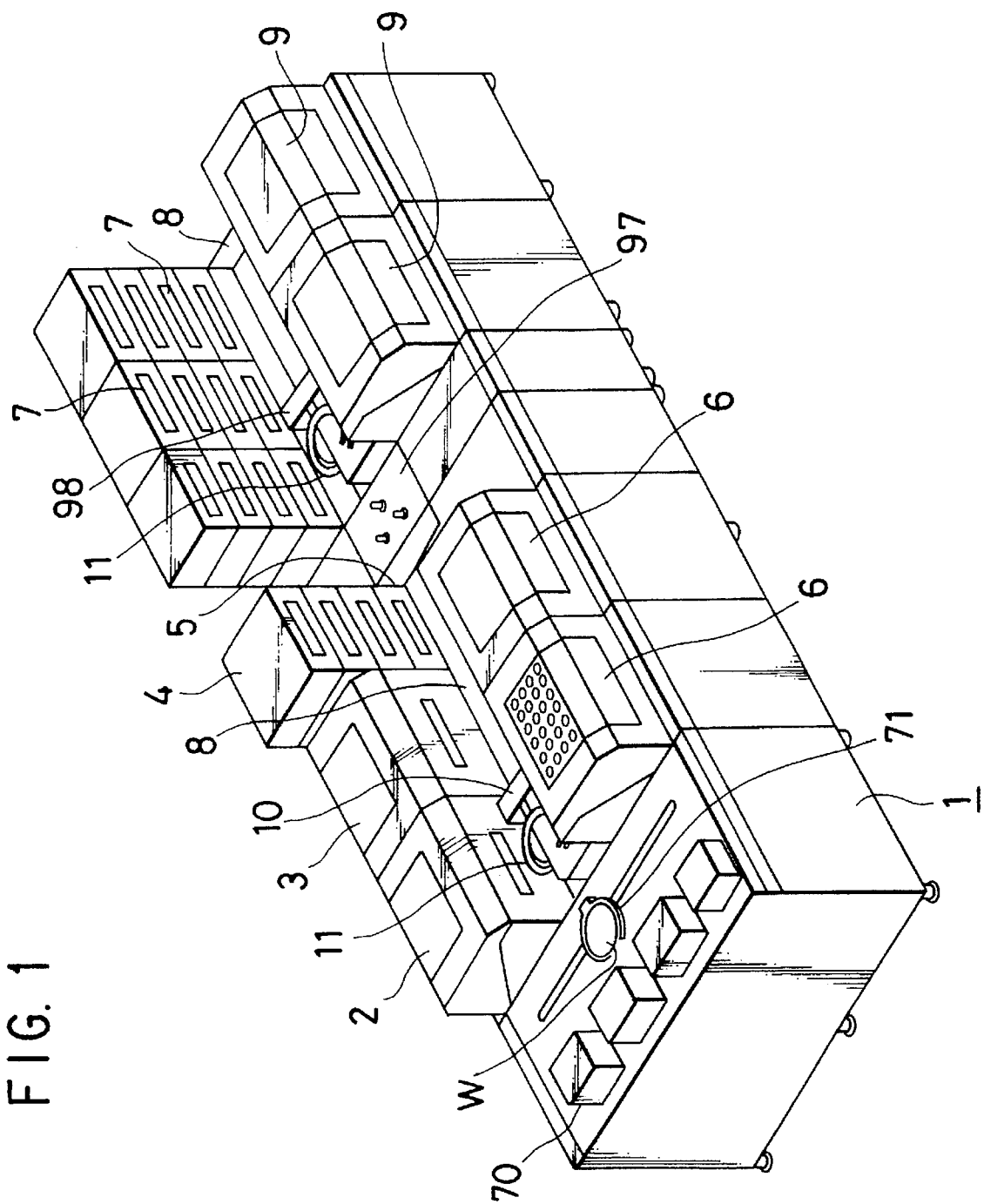
FIG. 1 is a general perspective view of a resist applying and developing apparatus according to one embodiment of the present invention.

FIG. 1 is a general plan view of a resist processing apparatus according to one embodiment of the present invention. The processing apparatus, as shown in FIG. 1, comprises a loading portion 1 for taking in and out a wafer or wafers W, a brush-cleaning unit 2 for brush-cleaning the wafers W delivered from the loading portion 1 as a pre-process when necessary, a jet-water cleaning unit 3 for cleaning the wafers W with jetting water under a high pressure, an adhesion processing unit 4 for performing a hydrophobic treatment on each wafer W, a cooling unit 5 for cooling the wafer W to a predetermined temperature, a resist applying unit 6 for applying resist to the surface of the wafer W and dissolving and removing the resist on the peripheral side wall of each wafer W by a side rinsing process as a post-process of the resist applying process, a heating unit 7 for heating the wafer W to perform pre-baking or post-baking, and a developing unit 9 for developing the wafer W. These units form a unitary structure in order to attain an excellent working efficiency.

In the central portion of the resist processing apparatus is provided a longitudinally extending substrate transferring passage 8. The units 1 to 7 and 9 are arranged along the transferring passage 8 and face forward. A substrate transfer mechanism 10 for transferring a wafer W between the units 1 to 7 and 9 is provided so as to be moveable along the substrate transferring passage 8.

The transfer mechanism 10 includes arms 11 for holding the respective wafers W by sucking them under vacuum or by supporting the portion of the undersurface of the respective one of the arms 11 which is in the vicinity of the peripheral side wall of the arm 11.

The arms 11 are three in number, for example, and are arranged in a superposed manner. They can be moved independently to the positions at which wafers W are loaded on the respective units 1 to 7 and 9 by means of the substrate transfer mechanism 10.

Use of three arms 11 allows the wafers W to be taken in or out of the units 1 to 7 and 9 simultaneously, thereby improving the process efficiency.

On the loading unit 1 houses a plurality of wafer cassettes 70 each of which is housed in a plurality of wafers W. The loading unit 1 is provided with a delivering mechanism 71 for taking out an unprocessed wafer W which is housed in one of the cassettes and positioning the wafer W.

The substrate delivering mechanism 10 which received wafers W from the delivering mechanism 71 transfers the wafers W to the units 1 to 7 and 9 such as the cleaning unit, the adhesion processing unit, the cooling unit, the resist applying unit, the pre-baking unit for exposure, development, post-baking and the like so as to facilitate the processing of the wafers W. Thereafter, the processed wafers W are delivered to the wafer cassettes 70 of the loading unit 1 and housed therein. In this way, a series of processes are completed.

Figure 2:
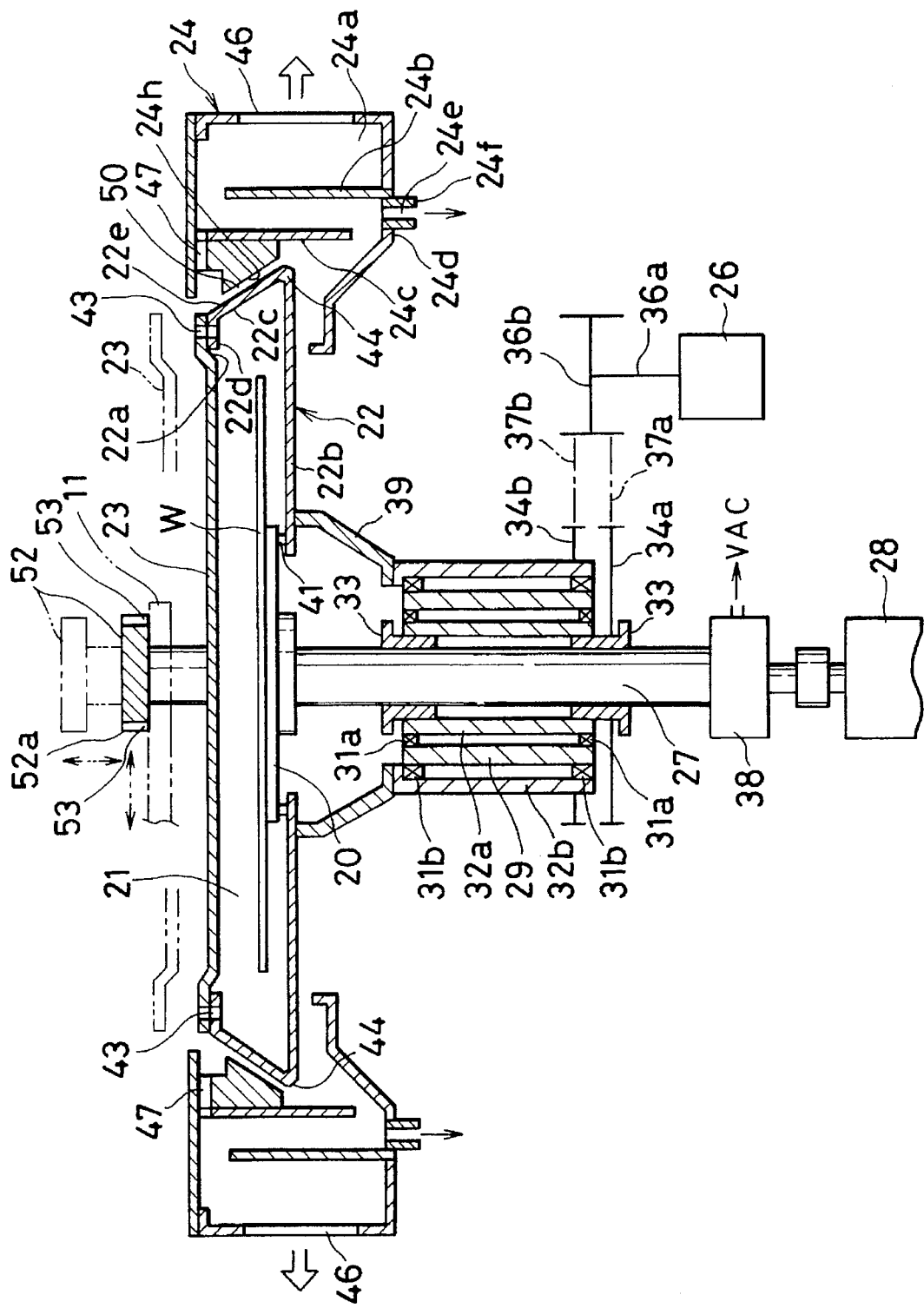
FIG. 2 is a general longitudinal cross-sectional view of the overall resist applying apparatus.

As shown in FIG. 2, the main portion of the resist applying unit 6 comprises a spin chuck 20 for sucking and holding an article to be processed and rotating in a horizontal plane, an open disk-shaped rotary cup 22 which opens upward and defines a process chamber 21 surrounding the upper portion and the outer peripheral portion of the spin chuck 20, a cover 23 removably mounted on the rotary cup 22 so as to cover the opening portion 22a of the rotary cup 22, and a ring-shaped drain cup 24 surrounding the outer periphery of the rotary cup 22.

The spin chuck 20 is rotated in a horizontal plan by a rotary shaft 27 which in turn is rotated by a driving motor 26 and lifted and lowered by the actuation of a lift cylinder 28 connected to the rotary shaft 27.

The rotary shaft 27 is axially slidably mounted in a spline bearing 33 fitted in the inner peripheral surface of a rotary inner tube 32a rotatably mounted in a fixed collar 29 through a bearing 31a. A driven pulley 34a is provided on the spline bearing 33. A belt 37a is wound on the driven pulley 34a and a driving pulley 36b mounted on the driving shaft 36a of the driving motor 26.

The operation of the driving motor 26 rotates the spindle chuck 20 through the belt 37a and the rotary shaft 27.

The lower end portion of the rotary shaft 27 is received in a cylindrical member and is connected to the lifting cylinder 28 by a vacuum seal portion 38. As the lifting cylinder 28 is driven, the rotary shaft 27 is moved vertically.

The rotary cup 22 is connected by a connecting tube 39 to the upper end of a rotary outer tube 32b mounted on the outer peripheral surface of the fixed collar 29 by a bearing 31b. A bearing 41 having a sealing function is provided between the bottom portion 22b of the rotary cup 22 and the undersurface of the spin chuck 20. The rotary cup 22 makes a relative rotation with respect to the spin chuck 20. The rotation of the driving motor 26 is transmitted to the rotary cup 22 through the belt 37b wound on the driven pulley 34b, which is mounted on the rotary outer tube 32b, and the driving pulley 36b mounted on the driving motor 26.

The diameter of the driven pulley 34b is the same as that of the driven pulley 34a and the belts 37a and 37b are wound on the same driving motor 26. Thus, the rotary cup 22 and the spin chuck 20 are rotated in the same direction.

Figure 4:
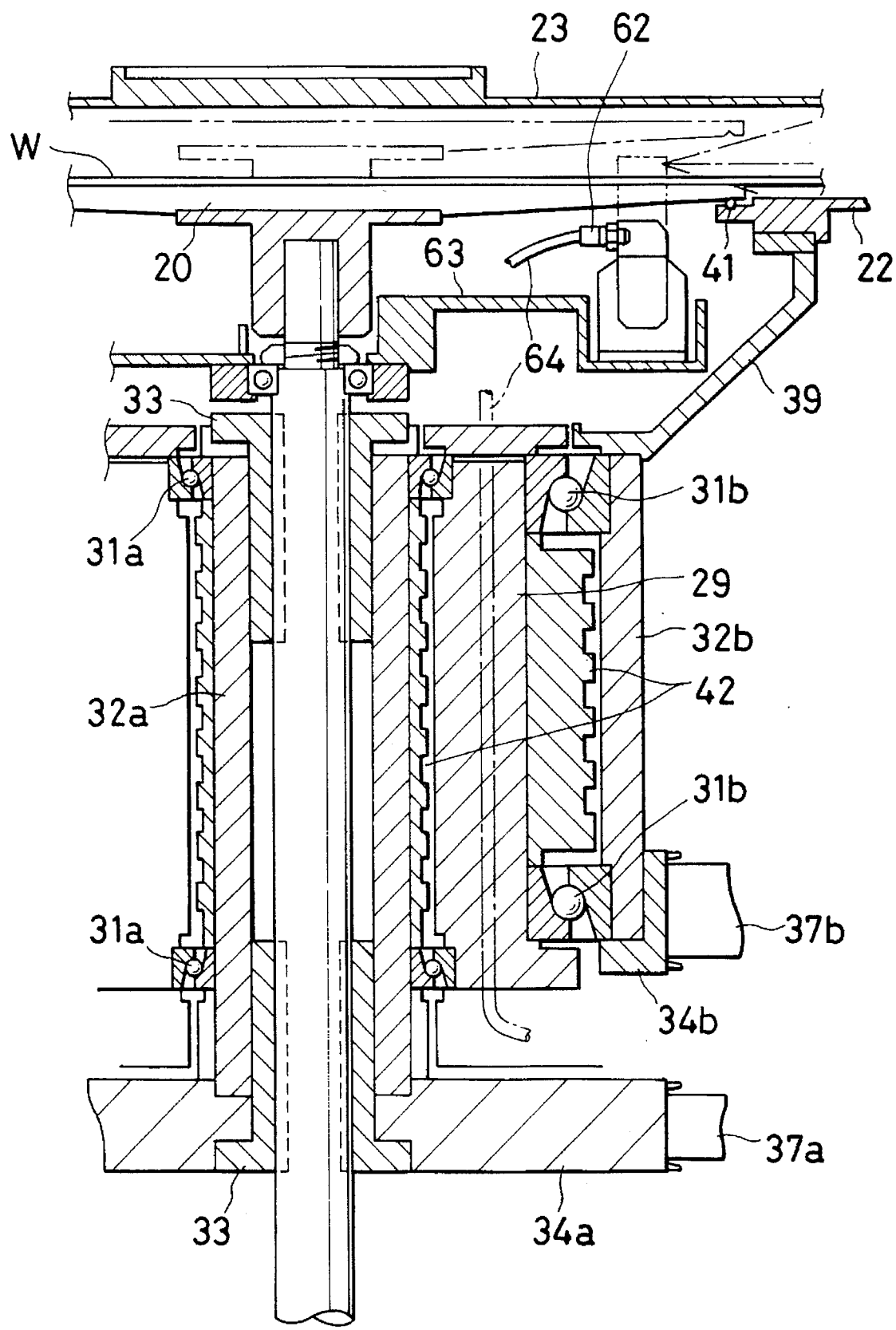
FIG. 4 is a general enlarged cross-sectional view of a rotating driving portion of the resist applying apparatus of FIG. 2.

As shown in FIG. 4 labyrinth sealing portions 42 are provided so as to face the fixed collar 29, the rotary inner tube 32a and the rotary outer tube 32b and prevent entrance of dust into the rotary shaft 22 from the driving system disposed thereunder during the processing.

Figure 3:
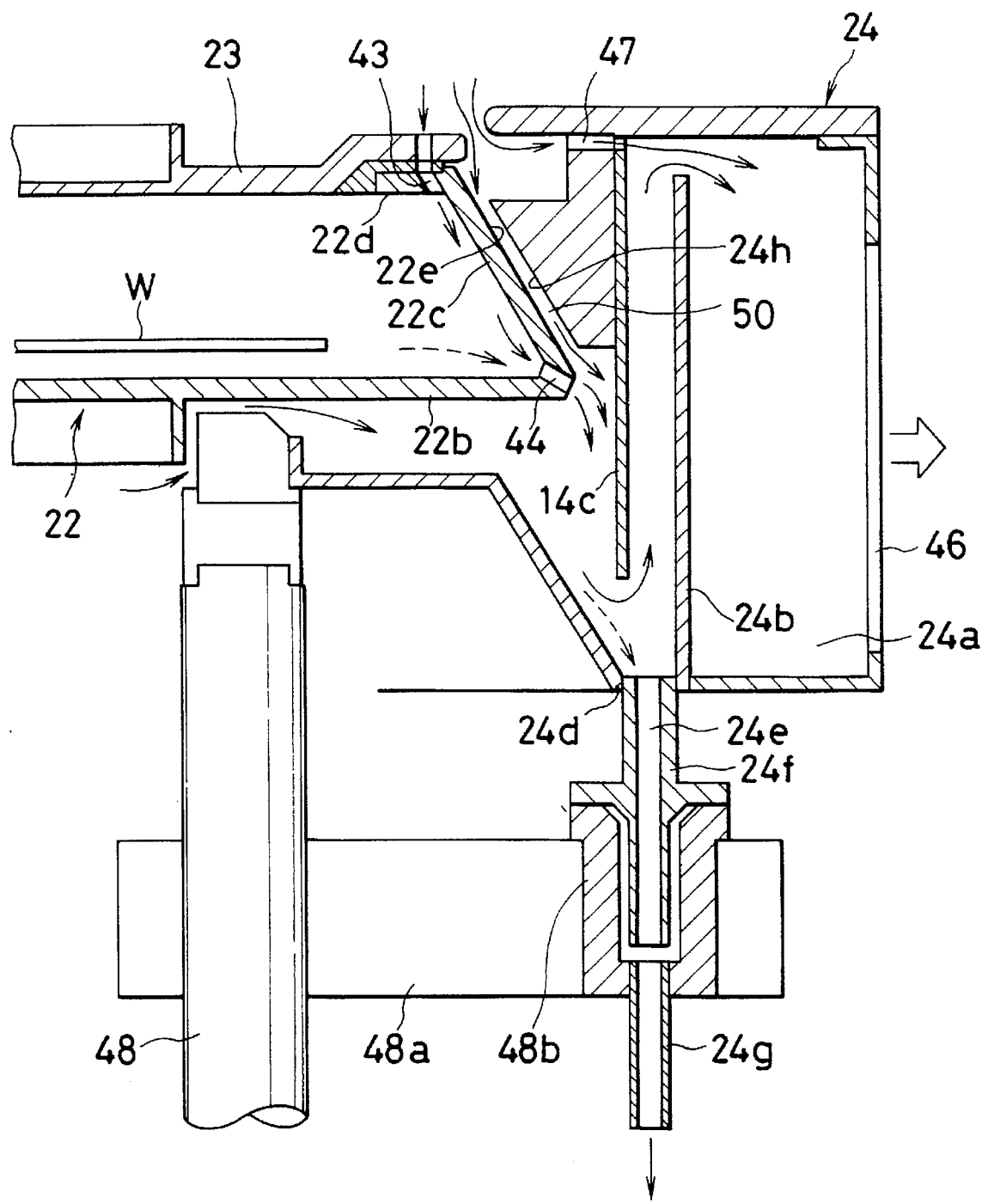
FIG. 3 is a general enlarged cross-sectional view of the main part of FIG. 2.

Referring to FIGS. 2 and 3, the inclined lateral wall 22c of the rotary cup 22 has a tapered surface 22e with the diameter reduced toward upward and is provided on its upper end with an inward extending flange 22d.

Air supplying holes 43 are arranged at suitable circumferential intervals in the inward extending flange 22d, and the other air exhaust holes 44 are formed also at suitable circumferential intervals in the boundary between the incline lateral wall 22c and the bottom 22b of the rotary cup 22.

As provision of the air exhaust holes 43 and 44 allows air having introduced into the process chamber 21 to flow externally through the air exhaust holes 44 during the rotation of the rotary cup 22, the pressure in the process chamber 21 is prevented from becoming negative during the rotation of the rotary cup 22, and the cover 23 can be opened easily without requiring a large force.

As shown in FIGS. 2, 3 and 4, annular passages 24a are formed in the drain cup 24. Exhaust ports 46, four in example, connected to an exhaust unit are formed spaced circumferentially of the outer peripheral side wall of the annular passage 24a, and radially extending exhaust passages 47 communicating with the exhaust ports 46 are formed in the lateral wall of the drain cup 24.

The air exhaust ports 46 in the outer peripheral portion of the drain cup 24 and the exhaust ports 46 formed in the upper portions of the drain cup 24 and communicating with the exhaust ports 46 prevent mist scattered by the centrifugal force in the rotation-process and flowing into the drain cup 24 through the air exhaust holes 44 from flying up to the upper portion of the rotary cup 22 and exhaust the mist externally through the air exhaust ports 46.

An outer wall 24b is erected from the bottom of the drain cup 24 and an inner wall 24c is suspended from the ceiling of the drain cup 24 so that the walls 24b and 24c define a meandering annular passage 24a to exhaust air uniformly. Drain holes 24e are formed at suitable circumferential intervals in a bottom portion 24d between the outer wall 24b and the inner wall 24c. As shown in FIG. 3, drain tubes 24f communicating with the drain holes 24e are removably inserted in and held by a joint 48b mounted in a bracket 48a attached to a support 48 for supporting the drain cup 24 and connected to a drain tube 24g. The drain cup 24 can be easily removed from the joint 48 for cleaning and repair.

A tapered surface 24h with the diameter reduced toward upward is formed on the inner peripheral wall of the drain cup 24 and is disposed close to the tapered surface 22e of the rotary cup 22. A very small gap 50 is defined between the tapered surface 22e of the rotary cup 22 and the tapered surface of the drain cup 24.

As the tapered small space 50 which opened more widely toward downward is formed, the pressure difference is generated from the peripheral speed difference between the upper and lower ends of the space 50 during the rotation of the rotary cup 22. The pressure difference increases the air flow flowing from above to downward and prevents the exhaust mist in the drain cup 24 from scattering outside of the rotary cup 22 through the small gap 50.

The mist which would tend to move upward through the space 50 to the tube outside of the rotary cup 22 is sucked at the exhaust passages 47, introduced into the drain cup 24 and then exhausted from the exhaust ports 46.

Figure 5:
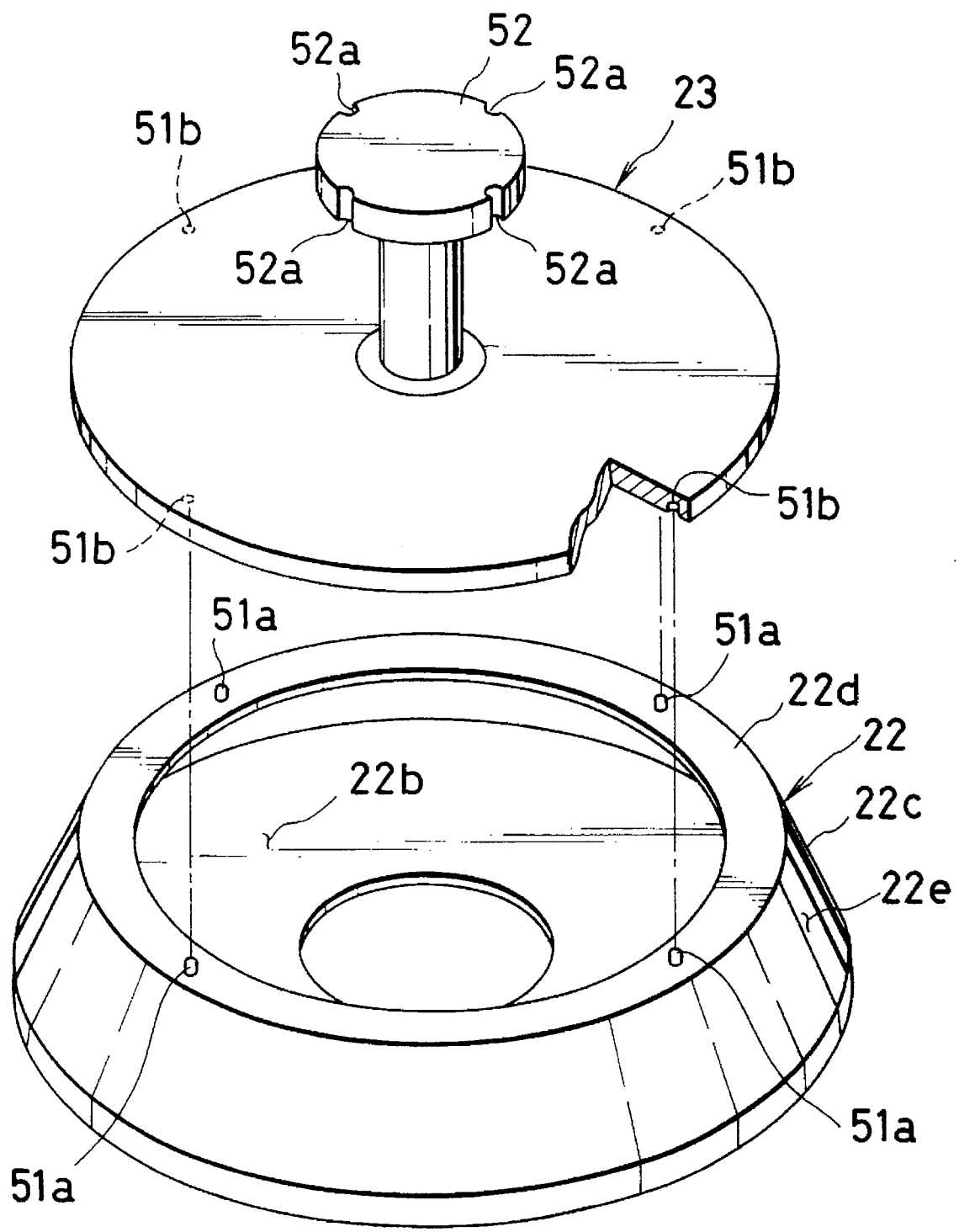
FIG. 5 is a general perspective view showing a rotary cup and a cover disassembled therefrom, of the resist applying apparatus of FIG. 2.
Figure 6:
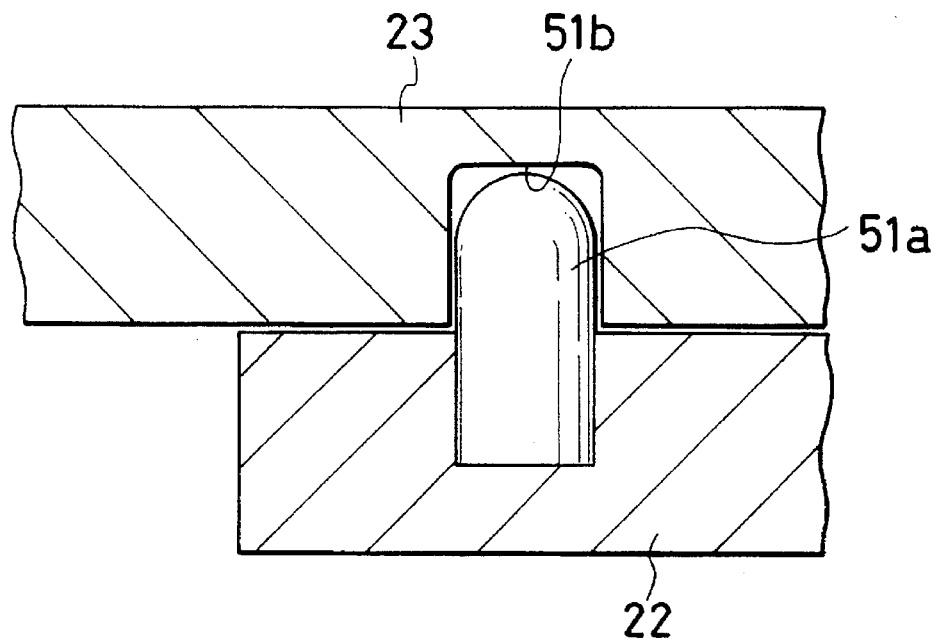
FIG. 6 is a general enlarged cross-sectional view showing a state in which the cover is fixed to the rotary cup, both depicted in FIG. 5.

During the rotation-processing, the cover 23 is fixed to the opening portion 22a of the rotary cup 22 and rotated integrally with the rotary cup 22. As shown in FIGS. 5 and 6, fixing pins 51a projecting from the upper portion of the rotary cup 22 toward the cover 23 engage fitting depressions 51b formed in the undersurface of the cover 23, thereby fixing the cover 23 to the rotary cup 22.

The top of each fixing pin 51a is formed spherical. Thus, dust is reduced which is generated by contact of the top of each fixing pin 51a with the respective fitting depression 51b.

Figure 7:
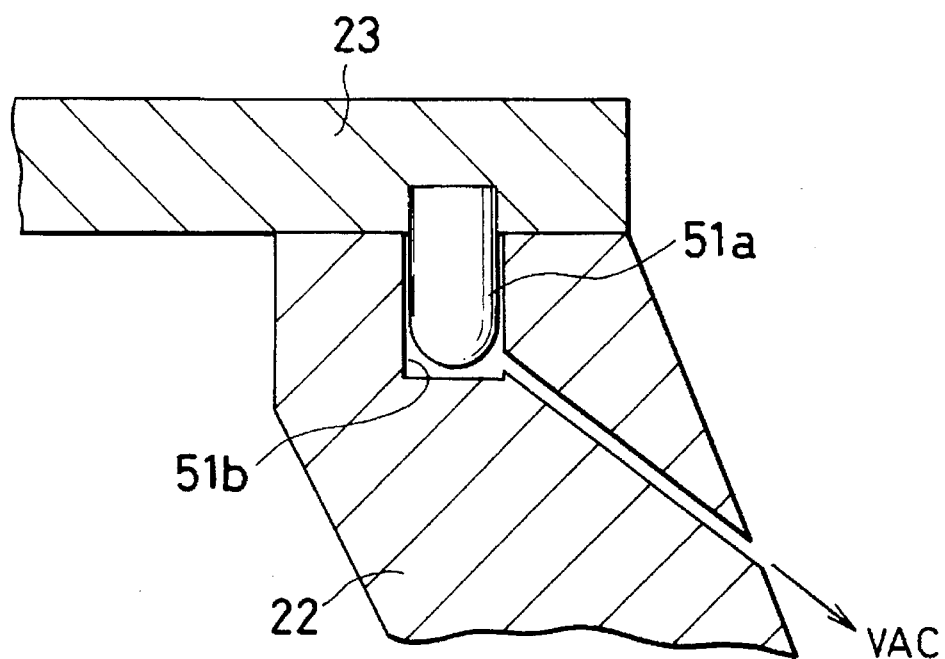
FIG. 7 is a general enlarged cross-sectional view showing another state in which cover is fixed to the rotary cup of FIG. 6.

The fixing pins 51a are not necessarily projected from the rotary cup 22 toward the cover 23 but may be projected from the cover 23 toward the rotary cup 22 and the fitting depressions 51b may be formed in the rotary cup 22, as shown in FIG. 7.

Dust generated by contact of the fixing pins 51a with the fixing depressions 51b may be exhausted at the fixing depressions 51b through exhaust holes connected thereto, as also shown in FIG. 7.

The cover 23 is opened and closed in the following ways. As shown by the imaginary lines in FIG. 2, the arm 11 is placed under a head 52 projecting upward from the upper surface of the cover 23. After engaging pins 52 projecting from the arm 11 have been engaged with engaging grooves 52a formed in the head 52, the arm 11 is lifted or lowered.

Positioning between the engaging grooves 52a of the head 52 and the engaging pins 53 of the arm 11 upon opening the cover 23 and positioning between the fixing pins 51a and the fitting depressions 51b can be performed by controlling the rotational angle of a driving motor 26 such as a servomotor or the like.

Fixing of the cover 23 to the rotary cup 22 is effected by fitting the fixing pins 51a to the fitting depressions 51b in this embodiment. However, the fixing structure is not always limited thereto. The cover 23 can be fixed to the rotary cup 22 by using a pushing mechanism. This structure can suppress generation of dust upon opening the cover 23 and prevent the cover 23 from rattling upon rotation-processing.

Examples of pushing mechanisms are shown in FIGS. 8 to 11, and FIGS. 12a and 12b.

Figure 8:
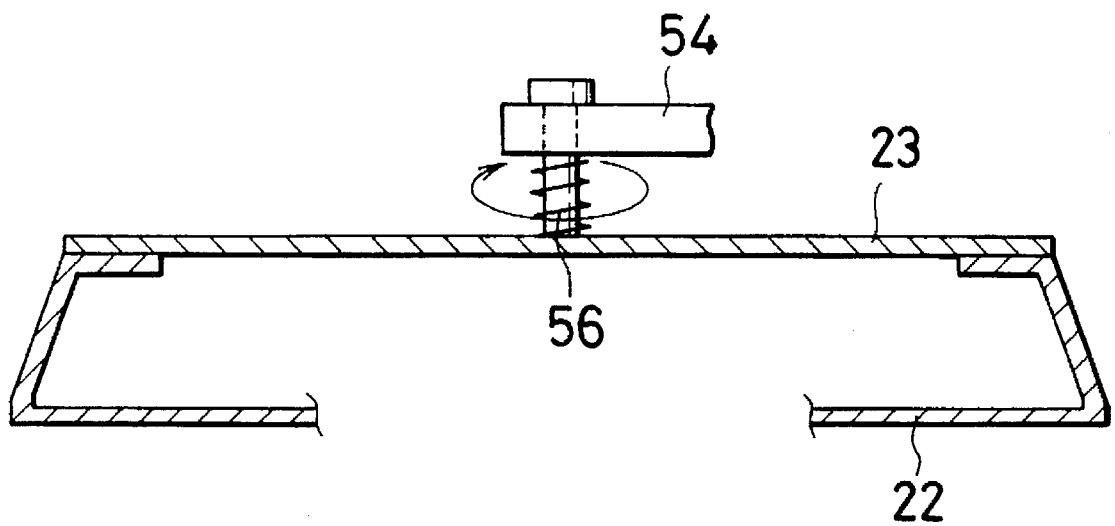
FIG. 8 is a general cross-sectional view showing a further state in which the cover is fixed to the rotary shaft of FIG. 5.

With the pushing mechanism as shown in FIG. 8, a coil spring 56 is stretch between the upper surface of the cover 23 and a suspending member 54 for rotatably suspending the cover 23 in such a way that the cover 23 is fixed to the rotary cup 22 by the urging force of the coil spring 56.

Figure 9:
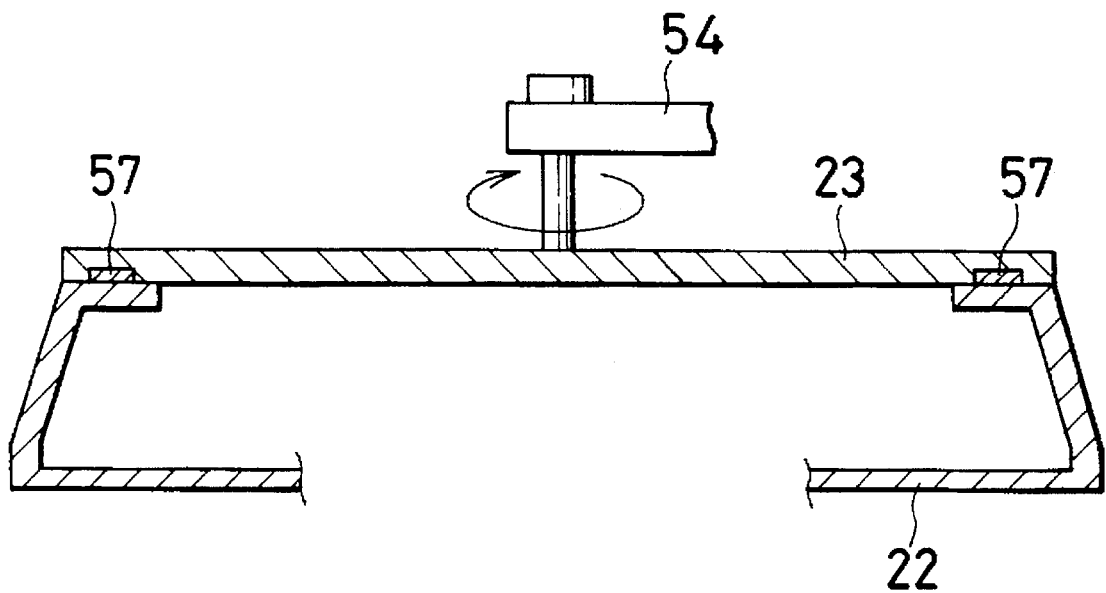
FIG. 9 is a general cross-sectional view showing another state in which the cover is fixed to the rotary shaft of FIG. 8.

The pushing mechanism as shown in FIG. 9 comprises magnets 57 provided in the undersurface of the cover 23, and the cover 23 is fixed to the rotary cup 22 by the attracting force of the magnets 57.

Figure 10:
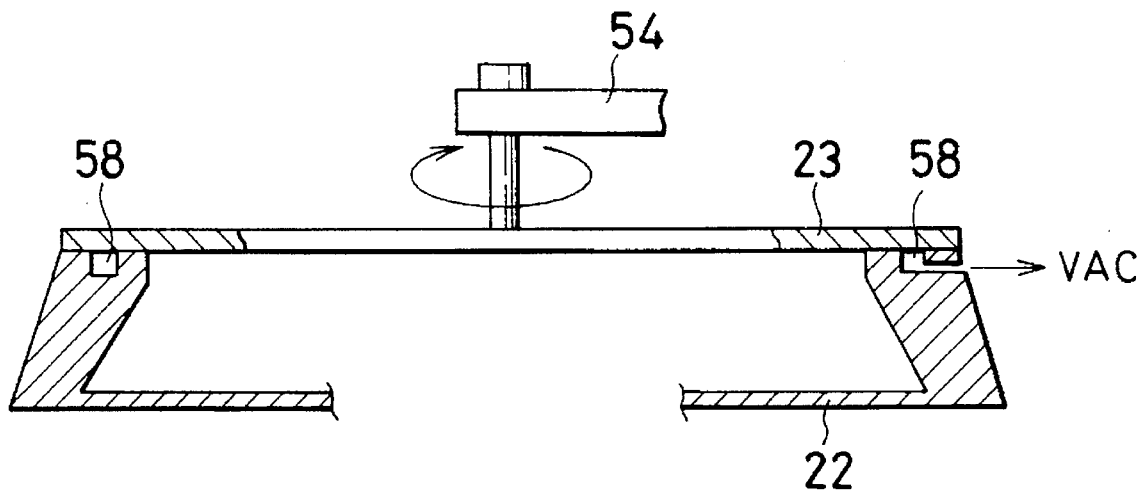
FIG. 10 is a general cross-sectional view showing a further state in which the cover is fixed to the rotary shaft of FIG. 8.

With the pushing mechanism as shown in FIG. 10, an annular sucking chamber 58 is formed in the peripheral portion of the upper surface of the rotary cup 22. The cover 23 is sucked and fixed to the rotary cup 22 by making the pressure in the sucking chamber 58 negative.

Figure 11:
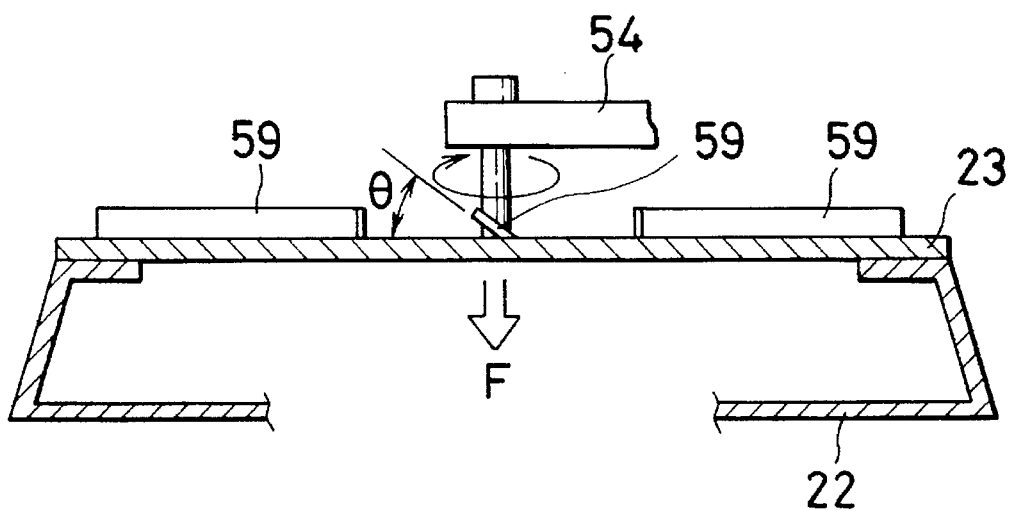
FIG. 11 is a general cross-sectional view showing another state in which the cover is fixed to the rotary shaft of FIG. 10.

With the pushing mechanism as shown in FIG. 11, an inclined wing element 59 having an inclination angle θ is rotatably mounted on the upper surface of the cover 23. As the cover 23 rotates, the wing element 57 exerts a component force F(sin θ) to the cover 23 in a direction perpendicular to the upper surface of the cover 23, and the cover 23 is pressed against and fixed to the rotary cup 22.

Figure 12A:
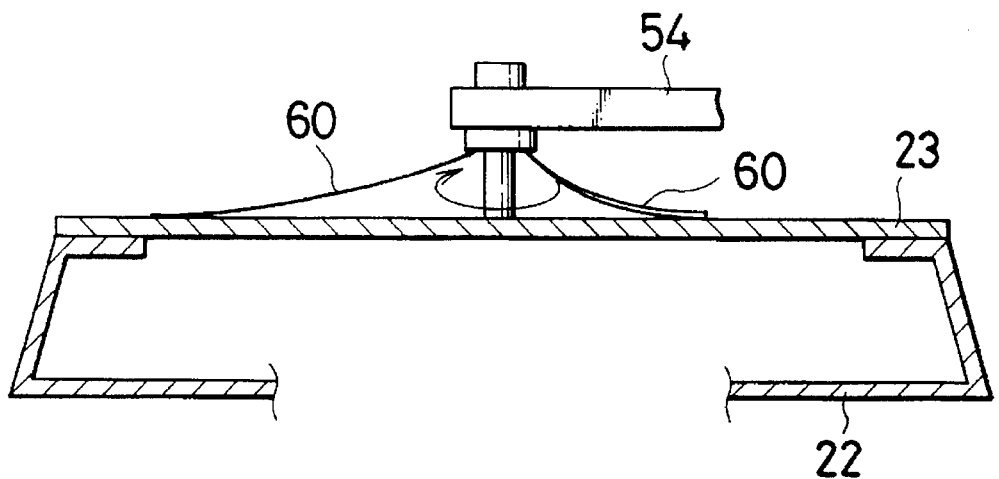
FIG. 12a is a general cross-sectional view showing a still further state in which the cover is fixed to the rotary shaft of FIG. 8.
Figure 12B:
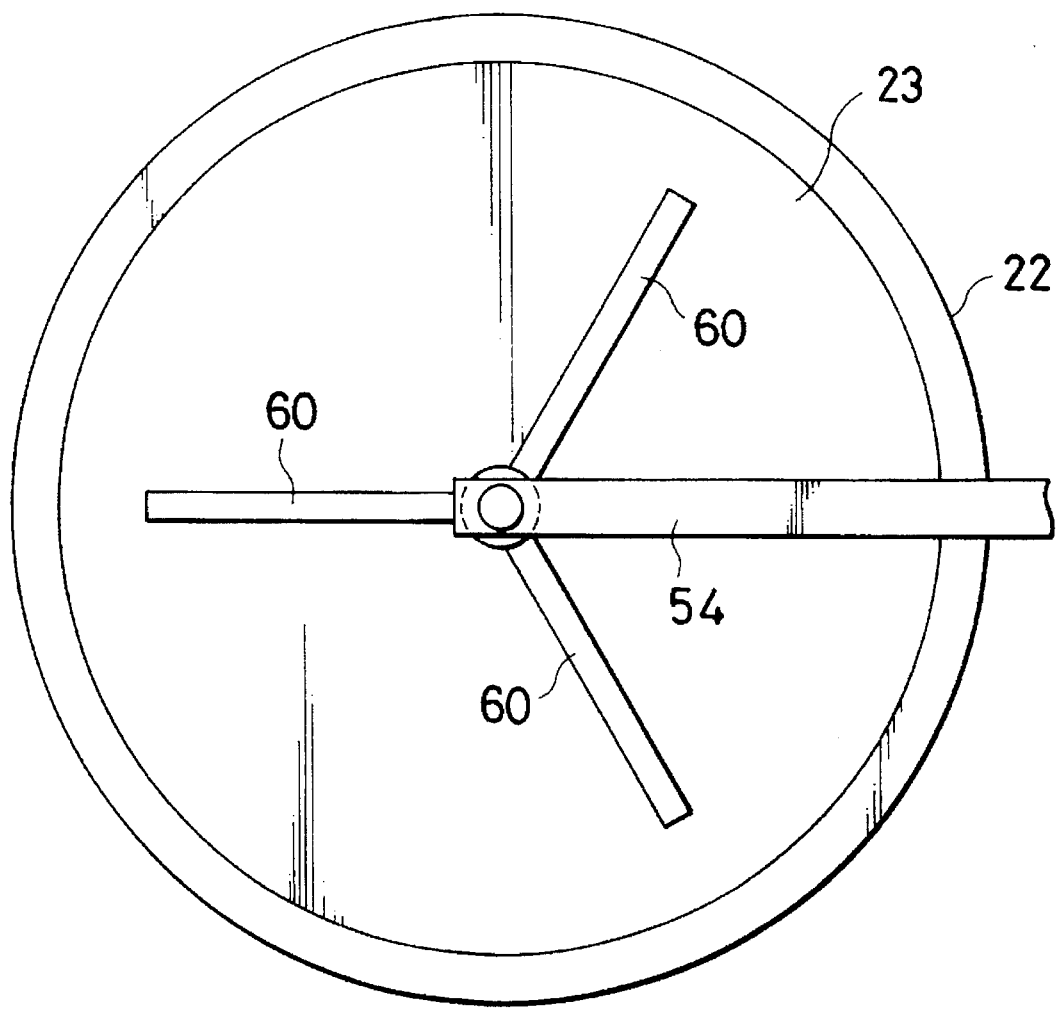
FIG. 12b is a general plan view of FIG. 8.

The pushing mechanism as shown in FIGS. 12a and 12b comprises a spring holding member 54, a plurality (three in these figures) of elastic plate springs 60 disposed between the undersurface of the spring holding member 54 and the upper surface of the cover 23. The biasing force of the plate springs 60 fixes the cover 23 to the rotary cup 22.

As shown in FIG. 4, cleaning nozzles 62 for cleaning the interior of the rotating rotary cup 22 and the rotating cover 23 can be provided in the connecting tube 39 irrotationally connected to the lower portion of the cover 23.

The cleaning nozzles 62 are held by a bracket 63 fixed to the rotary shaft 27. The spin chuck 20 is lifted to dispose the cleaning nozzles 62 between the spin chuck 20 and the bottom of the rotary cup 22. Then, a cleaning liquid is sprayed on the inner surfaces of the rotating rotary cup 22 and the cover 23.

The structure of the substrate transfer mechanism 10 will be described.

Figure 13:
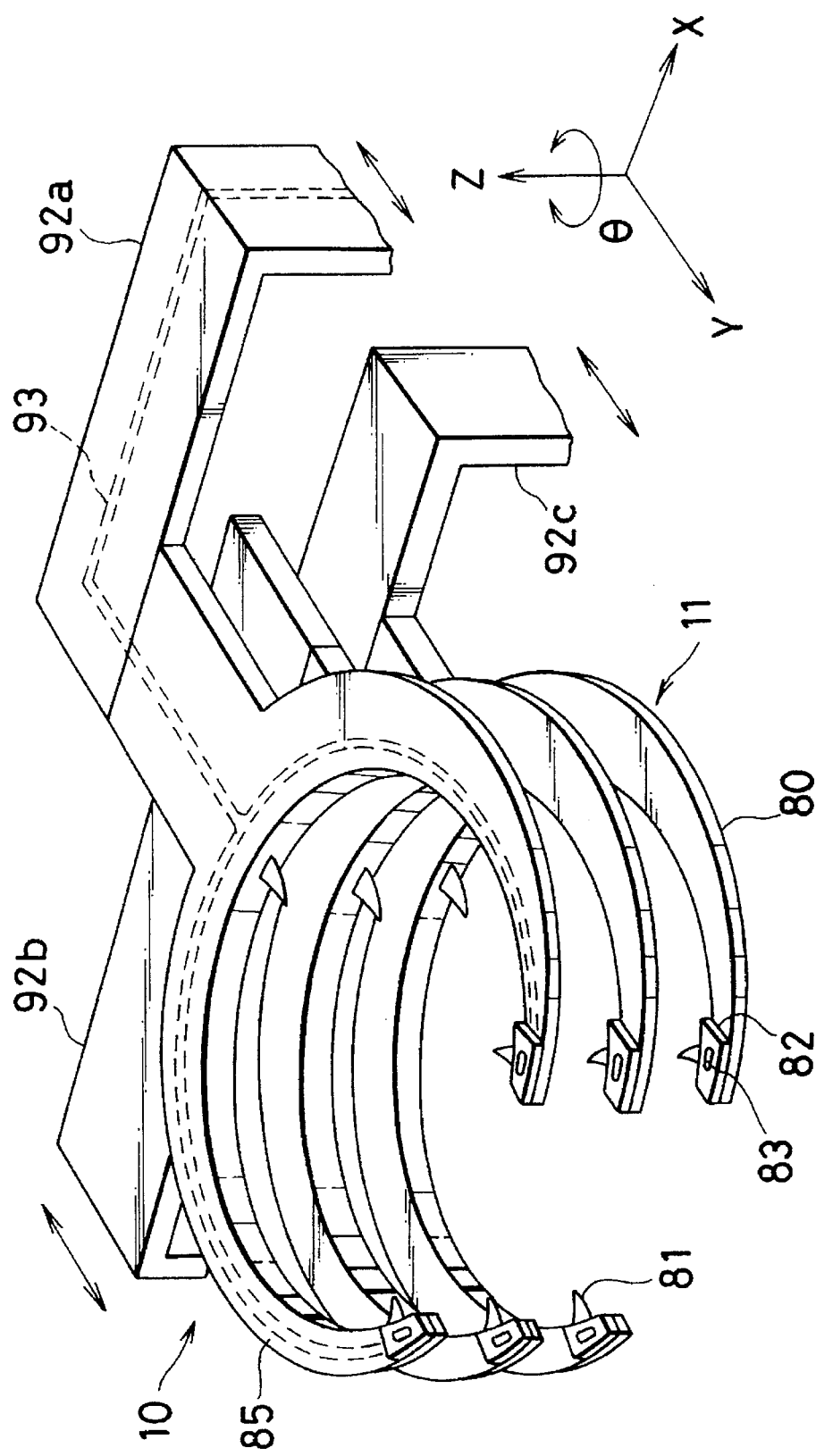
FIG. 13 is a general perspective view of an arm assembly of transferring means of one embodiment of the present invention.
Figure 14:
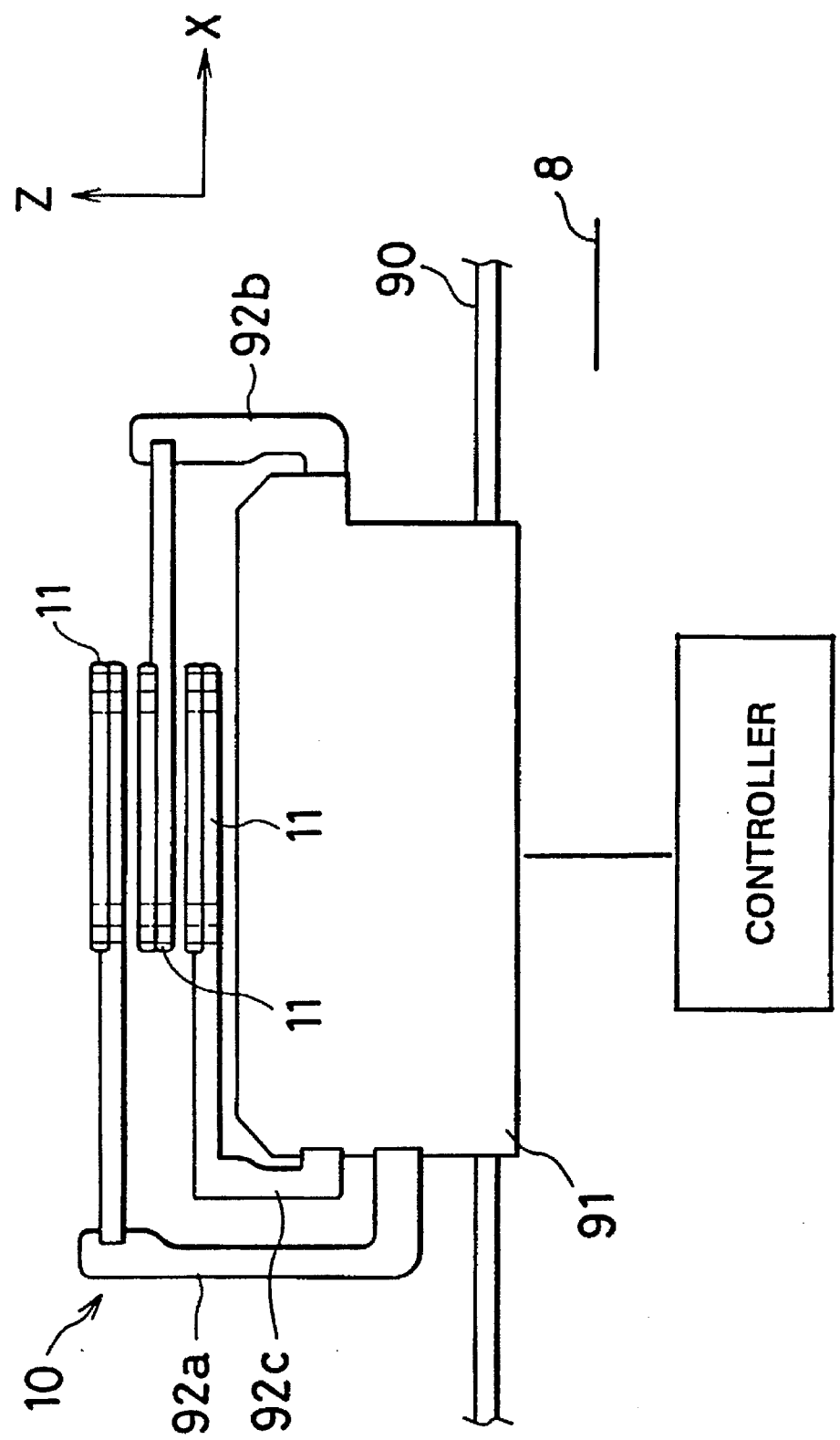
FIG. 14 is a general front view of the transfer mechanism of FIG. 13.

FIG. 13 is a general perspective view of arms 11 of the substrate transfer mechanism 10, and FIG. 14 is a general front view of the substrate transfer mechanism 10.

Figure 15:
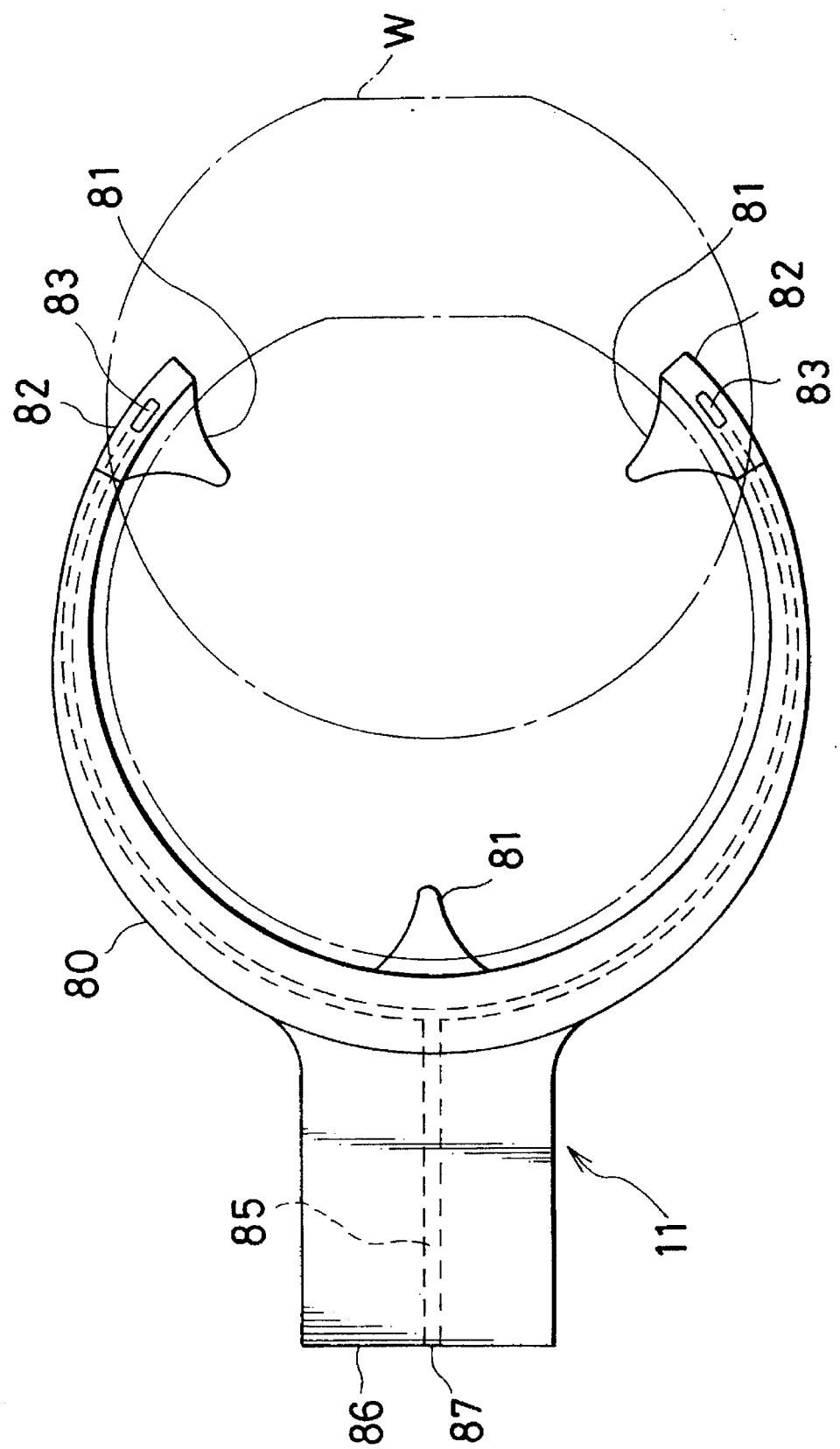
FIG. 15 is a general plan view of an arm which is the main part of FIGS. 13 and 14.

As shown in FIGS. 13 to 15, each arm 11 has an annular wafer supporting frame 80 having a cutout formed at its front portion, for example. At least three supporting elements such as pawls 81 are formed on at least three portions of inner peripheral side wall of the annular wafer supporting frame 80 to receive the peripheral portions of the undersurface of a wafer W to be transferred and stably support the wafer W.

Figure 16:
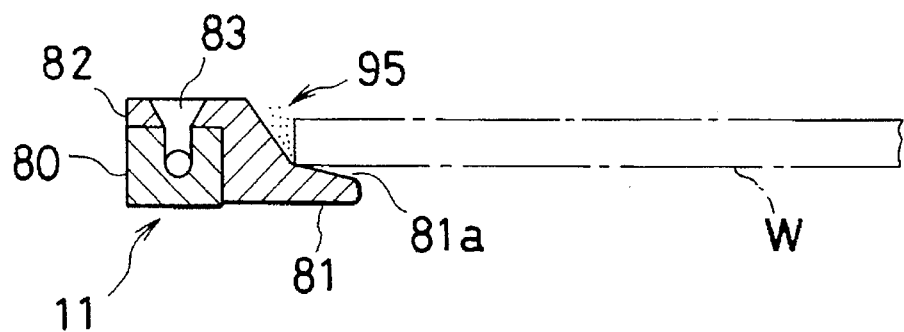
FIG. 16 is a general cross-sectional view showing a pawl and a wafer suction portion provided on a front end portion of the arm of FIG. 15.

As shown in FIG. 16 in an enlarged scale, each pawl 81 is provided on the inner peripheral side wall with an inclined surface 81a. The wafer W slides downward along the inclined surface 81a whereby the wafer W is prevented from being displace during its transfer and is positioned accurately.

As shown in FIGS. 13 and 14, the arm assembly of this embodiment consists of three arms 11. The three arms 11 can be independently moved in a horizontal direction (including the X direction and the Y direction), in a vertical direction (the Z direction) and in a rotational direction (the θ direction).

An example of a mechanism for moving the arms 11 includes a rotating unit comprising a stepping motor and a ball screw connected thereto or a sliding mechanism driven by a belt.

As shown in FIGS. 13, 15 and 16, each of the three arms 11 has a substrate sucking element 82 on each of the cutout ends of the wafer supporting frame 80, i.e., at least two substrate sucking elements in total. Each substrate sucking element 82 projects from the upper surface of the wafer supporting frame 80.

Referring to FIG. 15, an elongated suction port 83 is formed in the substrate sucking element 82 so as to extend circumferentially of the wafer supporting frame 80. The suction port 83 communicates with a suction port 87 formed in the proximal portion 86 of the arm 11 through an air passage 85 also formed in the proximal portion 86.

As shown in FIGS. 13 and 14, the substrate transfer mechanism 10 comprises a running block 91 movable along a transferring rail 90 provided on the substrate transferring passage 8, and the three arms 11 arranged over the running block 91 in a superposed state by supporting members 92a, 92b and 92c.

The suction ports 87 of the three arms 11 are connected to air passages 93 formed in the supporting members 92a, 92b and 92c so that air is sucked at the two suction ports 82 or each arm 11 simultaneously.

The distance between the wafer sucking portions 82 formed with the suction ports 83 on each arm 11 is slightly (by 2 to 3 millimeters, for example) smaller than the diameter of the wafer W so that the projecting substrate sucking portions 82 are in contact with the portions of the undersurface of the wafer W which are in the vicinity of the peripheral edge of the wafer W and sucks and holds the wafer W.

In other words, each arm 11 supports, at its two substrate sucking portions 82, two portions of the undersurface of the wafer W which are in the vicinity of the peripheral edge of the wafer W to hold the wafer W.

The transferring operation of the substrate transfer mechanism 10 with respect to the processing apparatus will be described.

When a resist liquid having low viscosity, which is used normally, is employed to perform resist-liquid application and development, the peripheral portion of three wafers W are supported by the pawls 81 and the wafers W are simultaneously taken in and taken out of the corresponding processing units 1 to 7 and 9.

This simultaneous delivery of the wafers W allows for efficient processing.

The arms 11 move toward the corresponding processing unit 1 to 7 and 9 so that the center of each wafer W sucked by and held on the respective substrate sucking portions 82, i.e., the center of each arm 11 defined by the pawls 81 on said each arm 11 is disposed just above the taking-in and taking-out center of the corresponding one of the processing units 1 to 7 and 9, when the wafers W are ten in and taken out.

In most cases where processing liquids having high viscosity such as polyamide are applied or side rinsing processes cannot be performed although resist liquids are used, wafers W are supported at their peripheral portions by the pawls 81 on the three arms 11 and are transported by the arms 11 to the next processing units.

When, however, the residue 95 of the processing liquid is attached to the pawls 81 of the arms 11, the residue is likely to hinder the holding of the wafers W. Such cases occur where polyamide is attached to the peripheral side wall of the wafer W when this material is applied to the wafer W by the applying unit 6 or when side rinsing cannot be performed for some reasons after a resist liquid has been applied to the wafer W, before its transfer. In these cases, two portions of the under surface of each wafer W which are in the vicinity of the peripheral side wall of the wafer W and are not applied with polyamide or a resist material, are sucked and held by the sucking portions so as to transfer the wafer W.

The transfer mechanism 10 is moved in such a way that the center of each wafer W sucked and held by the sucking portions 82 as shown in FIG. 15 coincides with the center of the receiving portion of the heating unit 7.

Either the holder for sucking and holding the wafers W, embodied as the substrate sucking portions 82, or the supporter for supporting the wafers W, embodied as the pawls 81, is selected according to (a) the state in which a layer extends to the peripheral portion of each wafer W or not, (b) the kind and/or the thickness of the layer formed on each wafer W, and (c) the processes to be performed.

The transferring operation of the wafers W to the applying unit 6 and the operation of the applying unit 6 will be described.

The arm 11, is placed under the head 52 of the cover 23, and the engaging pins 53 are engaged with the engaging grooves 52a of the head 52. The arm 11 lifts the cover 23 to open the opening 22a of the rotary cup 22.

When the wafers W hold by the arm 11 of the substrate transfer mechanism 10 is transferred to the opening 22a of the rotary cup 22, the spin chuck 20 is lifted by the elongation of the lift cylinder 28 and receives the wafer W to suck and hold it. After having transferred the wafer W to the spin chuck 20, the arm 11 of the substrate transfer mechanism 10 recedes from the upper portion of the rotary cup 22.

After the pin chuck 20 has received the wafer W, the lift cylinder 28 shrinks and the spin chuck 20 is lowered. Then, a resist liquid is supplied to the surface of the wafer W from above, or dropped thereon.

As the resist liquid supplying nozzles recede from the rotary cup 22, the arm 11 is moved again to mount the cover 23 on the rotary cup 22 and the process chamber 21 is sealed. The spin chuck 20, the rotary cup 22, the cover 23 and the wafer W are rotated in a body by the driving motor 26. The resist liquid is dispersed from the center to the peripheral edge of the surface of the wafer W by a centrifugal force, and a layer is formed.

Air conducted into the process chamber 21 through the air supplying holds 43 formed in the upper peripheral portion of the rotary cup 22 during the rotation-process flows out through the exhaust holes 44 formed in the outer and lower peripheral portion of the process chamber 21. Thus, the mist of the resist liquid scattered from the wafer W is carried by the air and exhausted into the external drain cup 24 through the exhaust holds 44.

The tapered space 50 increasing in diameter toward downward is formed between the tapered surface 22c of the rotary cup 22 and the tapered surface 24h of the drain cup 24. A pressure difference is generated by the centrifugal force due to the peripheral speed difference produced between the rotary cup 22 and the drain cup 24 during the rotation of the rotary cup 22. The pressure difference increase the air flow flowing from the outer and upper peripheral portion of the rotary cup 22 to the downward direction, thereby preventing scattering of the exhaust mist in the drain cup 24.

The air in the upper portion of the rotary cup 22 flows to the exhaust ports 46 through the exhaust passages 47. Thus, the mist flowing through the drain cup 24 and tending to fly upward is exhausted out through the exhaust ports 46.

As the mist flowing through the drain cup 24 passes the space defined between the inner wall 24b and the outer wall 24c of the drain cup 24, the mist is separated into a gas phase (air) and a liquid phase (waste water). The waste water is disposed of from the drain holes 24e and the air is exhausted out from the air exhaust ports 24.

Since air flows out through the air supplying holes 43, the process chamber 21 and the exhaust ports 44, the pressure of the process chamber 21 is prevented from being made negative. This makes it easy to open the cover 23 after processing and prevents dust together with the above air from entering the process chamber 21.

In the applying unit 6, the wafer W with which a resist liquid was spin-coated in a film state, for example, is lifted by the spin chuck 20. The spin chuck 20 can be raised, and it rotates the wafer W. Then, the wafer W waits in a receive state. After the arm 11 has been placed at the predetermined position in the applying apparatus 6, the spin chuck 20 is lowered or lifted to receive the wafer W from the wafer supporting frame 80 of the arm 11.

The two sucking portions 82 of the arm 11 contact the two portions of the undersurface of the peripheral portion of the wafer W and hold the wafer W under vacuum.

The substrate transferring unit 10 moves the arm 11 from the applying unit 6 to the predetermined position of the running block 91 and delivers the wafer W to another substrate transferring unit 98 via an interchanging mechanism 97. After the running block 91 is moved in front of the heating unit 7, the arm 11 is inserted in the heating unit 7 and the operation of the vacuum sucking unit is stopped.

Figure 17:
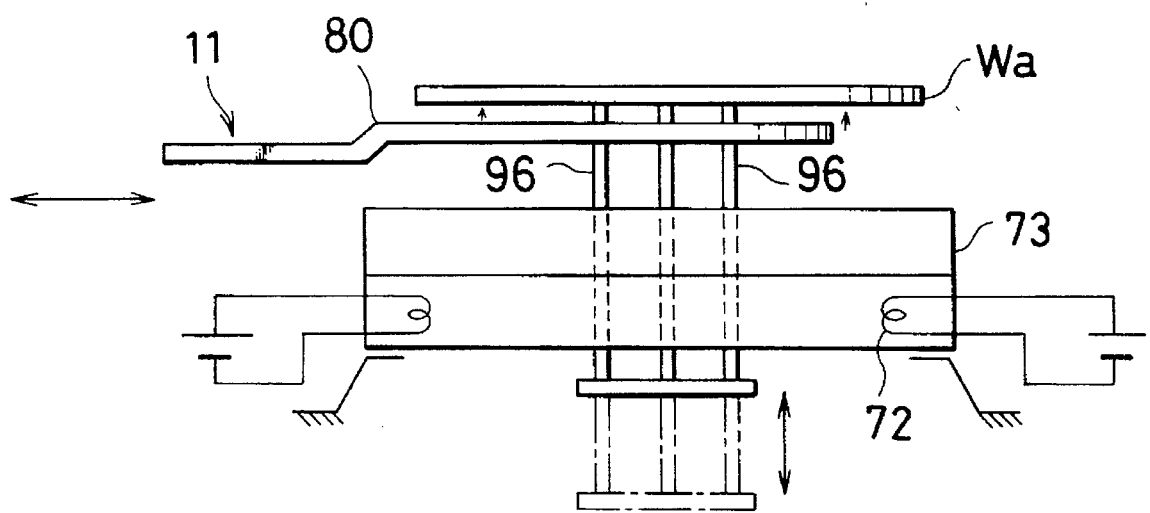
FIG. 17 illustrates how to take on article in and the processing apparatus in FIG. 1.

As the arm 11 is inserted in the heating unit 7 and disposed in a taking-in and out position, the three supporting pins 96 provided on a loading table 73, in which heaters 72 are housed are lifted, and the wafer W is delivered from the arm 11 to the supporting pins 96, as shown in FIG. 17.

Even if the residue 95 of polyamide or the resist liquid is attached to the peripheral portion Wa of the wafer W, the wafer W is not attached to the arm 14 and is easily separated therefrom, because the peripheral side wall Wa of the wafer W is not in contact with the arm 11. This allows the wafer to be taken in and taken out smoothly. Thus, the wafer W is not displaced from the predetermined position or does not drop when it is taken in or out.

The operation of the substrate transferring units 10 and 98 can be automatized by using a control unit, provided on the substrate transferring mechanism 10 and 98 and comprising a layer thickness sensor of an optical interference type for measuring the thickness of the layer formed on the peripheral portion Wa of the wafer W and a control element such as a micro computer for determining the kind of the layer based on the measuring result of the thickness of the layer.

For example, when the layer thickness on the surface of the wafer W is approximately 10 μm, the material of the layer is determined to be polyamide and the substrate sucking portions 82 are automatically selected for use.

When, on the other hand, the layer thickness is about 1 to 2 μm, the material of the layer is determined to be normal photoresist and the pawls 81 are automatically selected for use.

In case where the thickness of the layer on the peripheral side wall Wa of the wafer W is substantially 0.2 to 1 μm, it is determined that side rinsing cannot be carried out or an insufficient layer is formed, and the substrate sucking portions 82 are selected automatically.

For the layer thickness of 0.2 μm or less, it is determined that the process was the normal process in which side rinsing should be performed and the pawls 81 are selected automatically.

The determination of the kinds of the layers in this way is very effective to automatically select the articles to be used.

The moving range of the arm 11 and the selection of the handler of the article are simultaneously controlled automatically.

Figure 18:
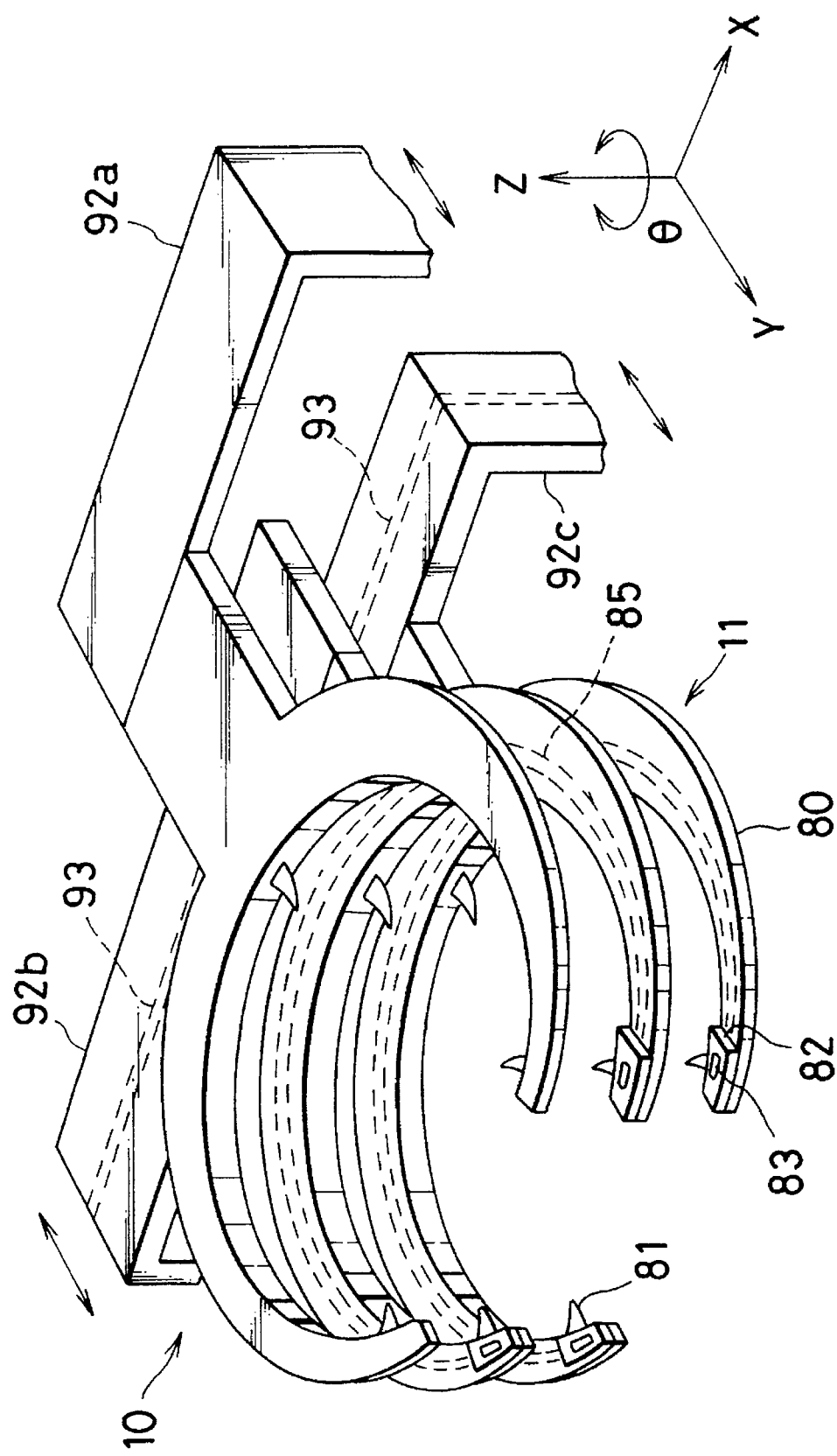
FIG. 18 is a general perspective view of an embodiment of an arm assembly which is different from that of FIG. 13.

FIG. 18 is a general perspective view of another embodiment of the arm assembly which is different from the arm assembly of FIG. 13.

The arm assembly of FIG. 18 comprises two lower arms 11 each having substrate sucking portions 82 for vacuum-sucking and holding wafers W and pawls 81 for supporting the wafers W in the same way as those of the substrate sucking portions 82 and the pawls 81 of the embodiment of FIG. 13, and the uppermost arm 11 having only pawls 81 for supporting a wafer W.

The arm assembly of this embodiment comprises a plurality of arms 11. It is natural that a plurality of wafers W are transferred simultaneously and throughout of the transportation of the wafers W is improved. In this arrangement, the uppermost arm 11 having only pawls 8 for supporting a wafer W is used to receive the wafer W from the delivering mechanism 71 shown in FIG. 1 and transfers the wafer W to the resist applying mechanism 6 before the wafer W is applied with a resist layer as an applied layer. The other two arms 11 play the role transferring the wafers W formed with the resist layers.

In other words, the uppermost arm 11 is used to transfer the wafers W whose transfer state is not required to be selected, and the other two lower arms 11 are used to transfer the wafers whose transfer state must be selected.

Therefore, every arm 11 need not be provided with the substrate sucking portions 82 for holding the wafers W by vacuum sucking and the pawls 81 for supporting the wafers W, and this arrangement reduces the manufacturing cost of the arm assembly. The combination of the arms can be selected according to their usage. Thus, their versatility can be improved.

The arm 11 having only the pawls 81 for supporting the wafer W is not limited to the uppermost arm but may be the intermediate arm or the lowermost arm. This arm 11 may have only substrate sucking portions 82 for holding the wafer W.

FIGS. 19a to 19c are other embodiments of arms which are different from the arm of FIG. 5.

On at lest two portions of the upper surface of the wafer supporting frame 80 of the arm 11 of FIG. 5 which are on the cutout portions of the frame 80 are provided substrate sucking portions 82 which project from the upper surface of the substrate supporting frame 80. However, the substrate sucking portion 82 of the arm 11 shown in FIG. 19a is provided on the proximal portion of the arm 11 and formed with an elongated sucking port 83 extending circumferentially of the supporting frame 80. The sucking port 83 communicates with a suction port 87 via an air passage 85 formed in the arm 11.

In the embodiment of FIG. 19b, the suction port 83 projects from the upper surface of the substrate supporting frame 80 by an amount of Y1. Y1 is maintained to a predetermined height ranging from 0.1 mm to 0.5 mm or so.

As shown in FIGS. 19a and 19c, at least two projections 100 are formed in the vicinity of the proximal portion of the arm 11 (for example, at least two portions on both sides of the proximal portion of the arm 11). The projections 100 support the wafer W held by the suction port 83 and prevents the wafer W from coming in contact with the substrate supporting frame 80 of the arm 11. Each projection 100 projects from the upper surface of the substrate supporting frame 80 by a height of Y2 similar to the height Y1 of the suction port 83.

It is preferred that the projections 100 be made of a material which produces little dust.

In this embodiment, the wafer W is transferred by the holding means for performing vacuum suction. Thus, the freedoms of the taking-in and taking-out positions of the loading unit 1 and the processing units 2 to 7 and 9 can be increased.

One embodiment of the detection of the state of an article to be processed will be described with reference to FIG. 20c.

Figure 20A:
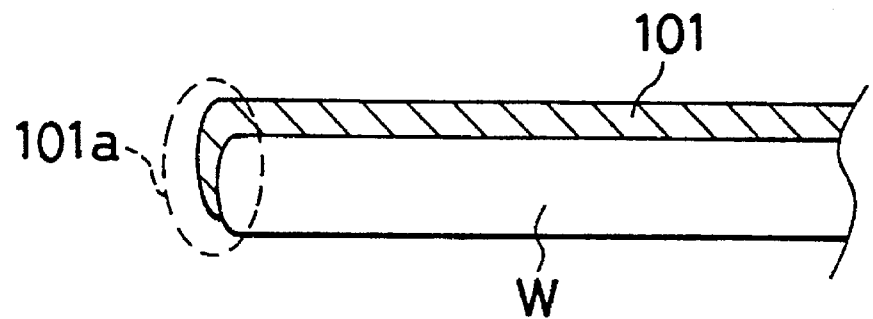
FIG. 20a is a general cross-sectional view of a state of an article to be processed according to one embodiment of the present invention.
Figure 20B:
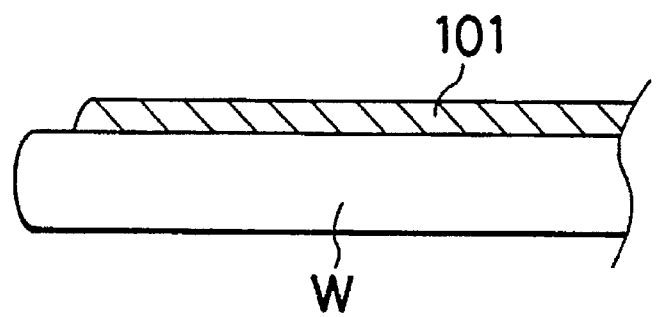
FIG. 20b is a general cross-sectional view of another state of an article to be processed according to another embodiment of the present invention.

FIGS. 20a and 20b show states of substrates such as wafers W which are being processed, based on which the holding means for sucking and holding the wafers W and the supporting means employing the pawls 81 for supporting the wafers W are selected, respectively.

More specifically, FIG. 20a shows a state in which a resist layer 101 as an applied layer is formed on the whole upper surface and the whole peripheral side wall of the wafer W by the resist applying unit 6 as shown in FIG. 1, and FIG. 20b shows a state in which a cleaning liquid or a rinsing liquid was supplied to the wafer W from the cleaning nozzles 62 as shown in FIG. 4 after a resist layer 101 had been formed on the wafer W and the portion 101a of the resist layer 101 attached to the peripheral side wall of the wafer W was removed.

The portion of the applied layer which is attached to the peripheral side wall of the wafer W cannot always be removed from all wafers W. When, for example, polyamide resin having higher viscosity than a resist liquid is applied to the wafer W and a cleaning liquid or a rinsing liquid is supplied to the portion of the polyamide layer which is attached to the peripheral side wall of the wafer W, this portion of the polyamide cannot be removed completely. In some cases, the peripheral side wall of the wafers W to which the polyamide resin is applied is not cleaned.

Figure 20C:
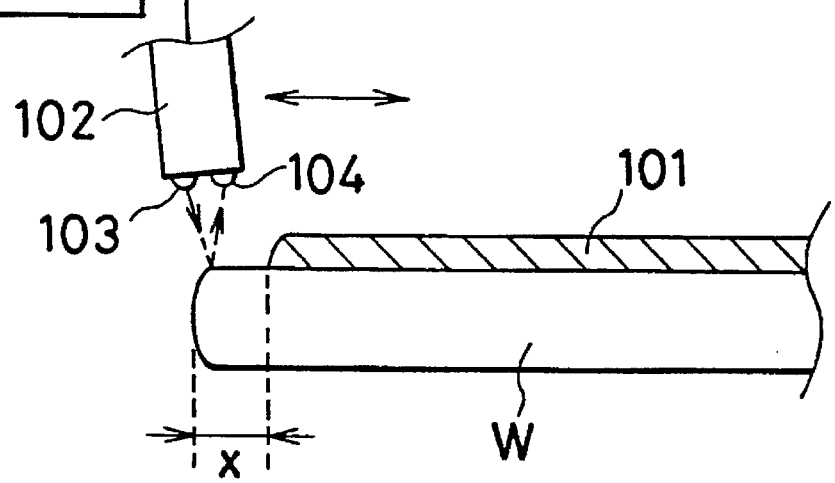
FIG. 20c is a general cross-sectional view of a further state of an article to be processed according to a further embodiment of the present invention.

When it has not been determined whether a portion of the applied layer exits or not on the peripheral side wall of the wafer W or it is necessary to check whether such layer exits or not there, an optical sensor 102 as shown in FIG. 20c can be used, for example. The optical sensor 102 has light omitting portions 103 which emit light having a predetermined wavelength.

The optical sensor 102 is moved radially of the wafer W and the light reflected from the wafer W or the resist layer is detected by a light receiving portion 104. In this way, it is checked whether the portion of the resist layer 101 still exists or not in a region of the wafer within X (5 mm, for example) from the peripheral edge.

When it is found by the optical sensor 102 that the portion of the resist layer 101 exists according to the result of the detection, the wafer W is held by the substrate sucking portions 82 of the arm 11. When, on the other hand, it is found by the optical sensor 102 that the portion of the resist layer 101 does not exist according to the result of detection, the wafer W is supported by the pawls 81.

When either the substrate sucking portions 82 for holding the wafer W or the pawls 81 for supporting the wafer W is previously selected and no detection is required for knowing whether the portion of the resist layer 101 exits or not on the peripheral side wall of the wafer W, registration must be made as to which of the substrate sucking portions 82 and the pawls 81 should previously be selected as a guiding mechanism for driving the arm 11.

The above-mentioned embodiments are described by using semiconductor wafers as articles to be processed. However, the articles may be LCD substrates, ceramic substrates, compact discs, printed substrates, substrates applied with paint, optical filter substrates or the like, which are applied with a process liquid.

The processing unit according to the present invention is applied to a resist applying and developing unit as described above but is no doubt applicable to an etching liquid applying unit, a magnetic liquid applying unit, a paint applying unit or the like.

When articles are processed in lots, the thickness of the layers are not measured and the selection of the supporting means and the control of the operation range can be included in the predetermined processes.

The present invention is not limited to the above-mentioned embodiments and modifications and is applicable to various modifications as long as they do not depart from the scope of the present invention.

What is claimed is:

1. A resist processing apparatus comprising:

a plurality of processing units for resist processing articles to be processed, each of said articles having a peripheral edge portion, an undersurface and an uppersurface portion;

a transferring unit in communication with said processing units for transferring said articles to said processing units, said transferring unit having arm means comprising supporting means for supporting said peripheral edge portion of each of said articles at a plurality of pawls of said transferring unit and holding means provided with sucking means to contact said undersurface portion of each of said articles for holding each of said articles; and selection means connected to said transferring unit for selecting either one of said supporting means and said holding means according to a condition of each of said articles.

2. A resist processing apparatus comprising:

a plurality of processing units for resist processing articles to be processed, each of said articles having a peripheral edge portion, an undersurface and an uppersurface portion;

a transferring unit in communication with said processing units for transferring said articles to said processing units, said transferring unit having arm means comprising supporting means for supporting said peripheral edge portion of each of said articles at a plurality of pawls of said transferring unit and holding means provided with sucking means to contact said undersurface portion of each of said articles for holding each of said articles; and control means connected to said transferring unit for selecting either of said supporting means and said holding means according to a condition of each of said articles and for automatically controlling an operating range of said arm means so as to hold and transfer each of said articles.

3. A resist processing apparatus comprising:

a plurality of processing units for resist processing articles to be processed, each of said articles having a peripheral edge portion, an undersurface and an uppersurface portion;

a transferring unit in communication with said processing units for transferring said articles to said processing units, said transferring unit having arm means comprising supporting means for supporting said peripheral edge portion of each of said articles at a plurality of pawls of said transferring unit and holding means provided with sucking means to contact said undersurface portion of each of said articles for holding each of said articles; and selecting means connected to said transferring unit for selecting said holding means when each of said articles which has been applied with a coating liquid and from a peripheral side wall portion of which said coating liquid has not yet been removed is transferred to at least a heating unit which is one of said processing units.

4. A substrate processing apparatus comprising:

a plurality of processing units for performing predetermined processes on substrates; and a transferring unit in communication with said processing units for transferring said substrates to said processing units; said transferring unit having arm means comprising supporting means for supporting said peripheral edge portion of each of said substrates at a plurality of pawls of said supporting means and holding means provided with sucking means to contact an undersurface portion of each of said substrates for holding each of said substrates, detecting means for detecting a thickness of a layer formed on each of said substrates, and selecting means connected to said detecting means for selecting either of said supporting means and said holding means based on a detected result of said thickness of said layer on each of said substrates, which thickness is obtained from the detecting means.

5. A substrate processing apparatus according to claim 4, wherein said detecting means selects either of said supporting means and said holding means according to a condition of each of said substrates.

6. A substrate processing apparatus according to claim 4, wherein said selecting means selects either of said supporting means and said holding means according to a condition of each of said articles and automatically controls an operating range of said arm means so as to hold and transfer each of said substrates.

7. A substrate processing apparatus according to claim 4, wherein said selecting means selects said supporting means for supporting each of said substrates when said thickness of each of said substrates detected by said detecting means is one of (a) not more than about 0.2 μm, or (b) about 1 to 2 μm.

8. A substrate processing apparatus according to claim 4, wherein said selecting means selects said holding means when each of said substrates which has been applied with a coating liquid and from a peripheral side wall of which said coating liquid has not yet been removed is transferred at least to a heating unit which is one of said processing units.

9. A resist processing apparatus as claimed in claim 4, wherein the detecting means is an optical sensor.

10. A method of transferring articles from arm means movably mounted on a transferring unit for transferring said articles and comprising supporting means having a plurality of supporting portions for supporting each of said articles and holding means having sucking means for holding each of said articles, said method comprising the steps of:

selecting either of said supporting means and said holding means; and transferring each of said articles by said arm means, wherein either of said supporting means and said holding means is selected according to a condition of each of said articles, an operating range of each of said articles is controlled automatically and each of said articles is transferred.

11. A method of transferring articles from arm means movably mounted on a transferring unit for transferring said articles and comprising supporting means having a plurality of supporting portions for supporting each of said articles and holding means having sucking means for holding each of said articles, said method comprising the steps of:

selecting either of said supporting means and said holding means;

transferring each of said articles by said arm means; and detecting a thickness of each of said articles wherein said supporting means is selected when the detected thickness of each of said articles is one of (a) not more than approximately 0.2 μm, or (b) approximately 1 to 2 μm, and each of said articles is supported and transferred by said supporting means.

12. A resist processing apparatus for processing a semiconductor wafer comprising:

a transfer mechanism for transferring the semiconductor wafer;

a first handling means and a second handling means coupled to the transfer mechanism for holding the semiconductor wafer;

a detector for detecting a state of residue on the peripheral edge of the semiconductor wafer; and a controller in communication with said transfer mechanism and said detector for selecting one of the first and the second handling means for holding the semiconductor wafer according to the result of the detection.

13. A resist processing apparatus as claimed in claim 12, wherein the transfer mechanism has a circular arm and the first handling means includes a plurality of pawls provided on an inner circumference of the arm.

14. A resist processing apparatus as claimed in claim 12, wherein the transfer mechanism has a circular arm, and the second handling means includes suction members which hold the semiconductor wafer by suction.

15. A resist processing apparatus comprising:

a plurality of processing units for resist processing articles to be processed, each of said articles having a peripheral edge portion, an undersurface and uppersurface portion;

a transferring unit in communication with said processing units for transferring said articles to said processing units, said transferring unit having arm means comprising supporting means for supporting said peripheral edge portion of each of said articles at a plurality of pawls of said transferring unit and holding means provided with sucking means to contact said undersurface portion of each of said articles for holding each of said articles;

a detector for detecting a surface condition of said articles; and a controller in communication with said transferring unit and said detector for selecting and controlling either of the pawls or said sucking means for holding said articles in accordance with the detected condition where the transferring unit has both said pawls and said sucking means, wherein said arms means includes a plurality of arms.

* * * * *